US008059467B2

(12) United States Patent
Kim et al.

(10) Patent No.: US 8,059,467 B2
(45) Date of Patent: Nov. 15, 2011

(54) MEMORY DEVICE AND MEMORY PROGRAMMING METHOD

(75) Inventors: Jae Hong Kim, Seoul (KR); Kyoung Lae Cho, Yongin-si (KR); Yong June Kim, Seoul (KR); Dong Hyuk Chae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 459 days.

(21) Appl. No.: 12/382,351

(22) Filed: Mar. 13, 2009

(65) Prior Publication Data
US 2009/0296486 A1  Dec. 3, 2009

(30) Foreign Application Priority Data

May 28, 2008 (KR) .................. 10-2008-0049830

(51) Int. Cl.
*G11C 11/34* (2006.01)
*G11C 16/04* (2006.01)

(52) U.S. Cl. .............................. 365/185.19; 365/185.22

(58) Field of Classification Search .............. 365/185.19, 365/185.18, 185.22, 185.24
See application file for complete search history.

(56) References Cited

U.S. PATENT DOCUMENTS 7,020,017 B2 * 3/2006 Chen et al. ............... 365/185.03
7,564,714 B2 * 7/2009 Kang ........................ 365/185.17

FOREIGN PATENT DOCUMENTS

| JP | 11-110977 | 4/1999 |
|---|---|---|
| KR | 10-2005-0116283 | 12/2005 |
| KR | 2006-0021097 | 3/2006 |
| KR | 2006-0104395 | 10/2006 |
| WO | WO 2005/043548 | 5/2005 |

* cited by examiner

*Primary Examiner* — Anh Phung
(74) *Attorney, Agent, or Firm* — Harness, Dickey & Pierce, P.L.C.

(57) ABSTRACT

Memory devices and/or memory programming methods are provided. A memory device may include: a memory cell array including a plurality of memory cells; a programming unit configured to apply a plurality of pulses corresponding to a program voltage to a gate terminal of each of the plurality of memory cells, and to apply a program condition voltage to a bit line connected with a memory cell having a threshold voltage lower than a verification voltage from among the plurality of memory cells; and a control unit configured to increase the program voltage during a first time interval by a first increment for each pulse, and to increase the program voltage during a second time interval by a second increment for each pulse. Through this, it may be possible to reduce a width of a distribution of threshold voltages of a memory cell.

21 Claims, 11 Drawing Sheets

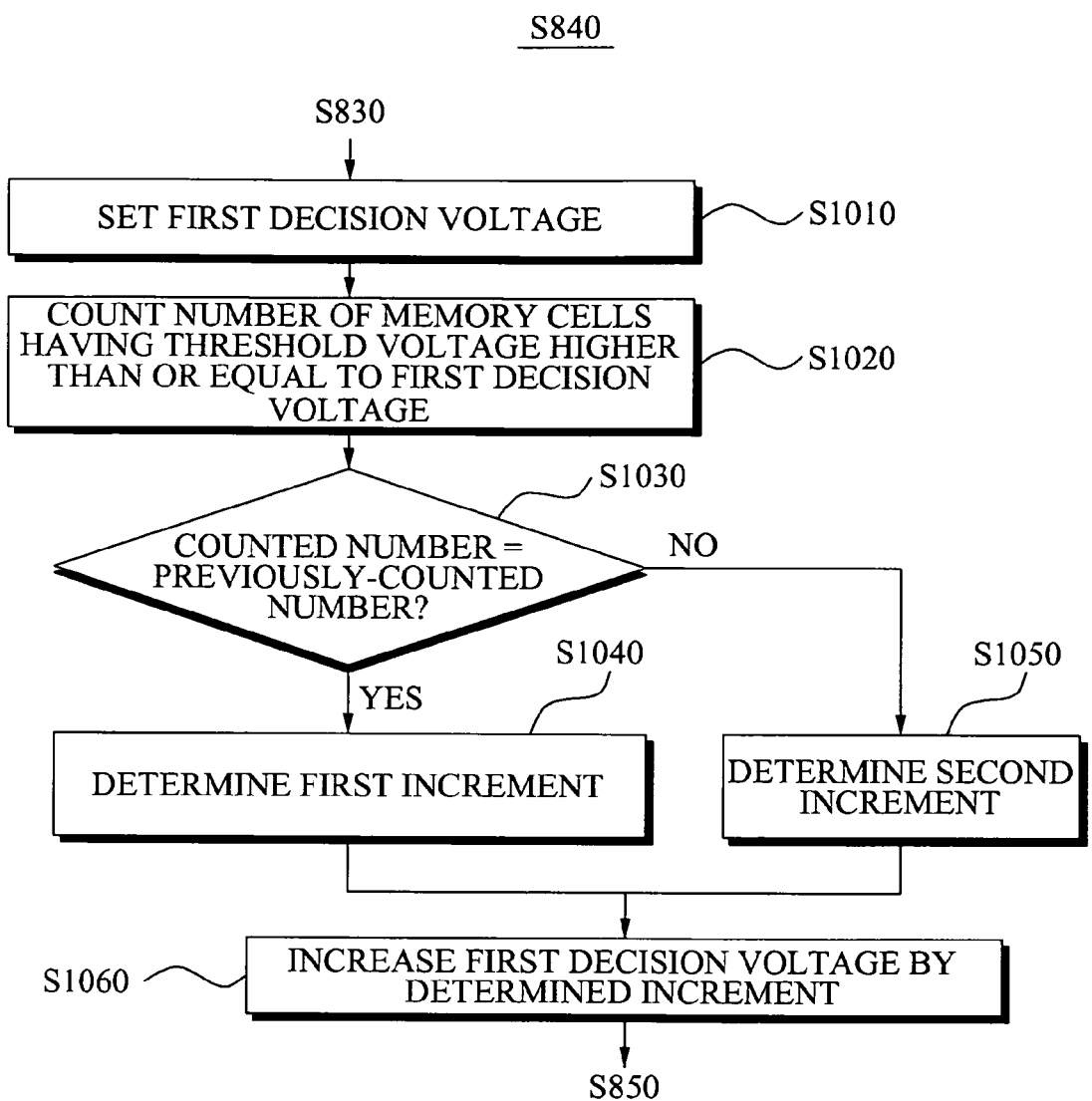

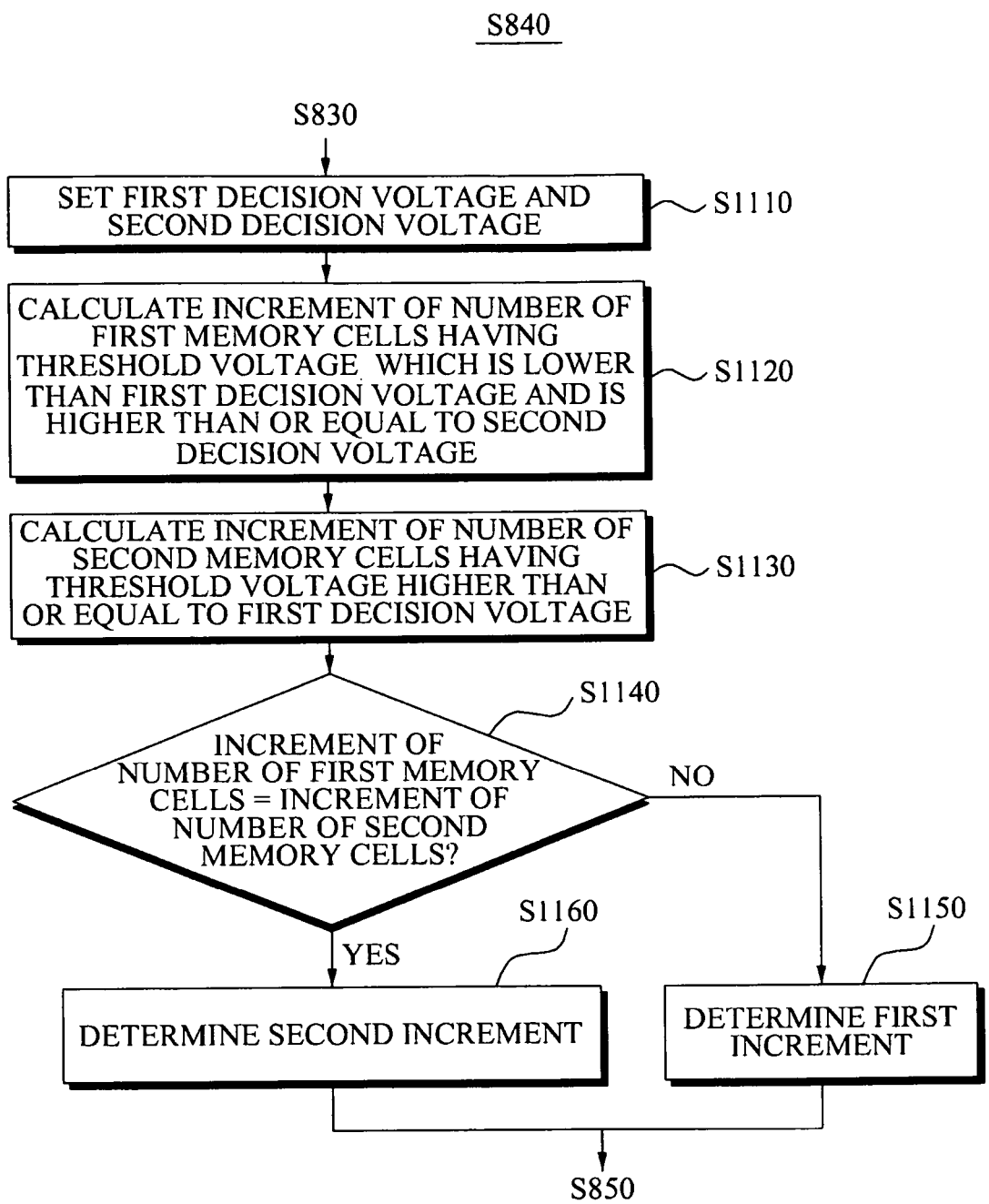

ions that may program data in memory devices. Also, example
MEMORY DEVICE AND MEMORY PROGRAMMING METHOD

PRIORITY STATEMENT

This application claims priority under 35 U.S.C. §119 to Korean Patent Application No. 10-2008-0049830, filed on May 28, 2008, in the Korean Intellectual Property Office (KIPO), the entire contents of which are incorporated herein by reference.

BACKGROUND

1. Field

Example embodiments relate to apparatuses and/or methods that may program data in memory devices. Also, example embodiments relate to apparatuses and/or methods that may program data in multi-level cell (MLC) memory devices or multi-bit cell (MBC) memory devices.

2. Description of Related Art

A single-level cell (SLC) memory device may store one bit of data in a single memory cell. The SLC memory is referred to as a single-bit cell (SBC) memory. A process of storing the data in a memory cell (a single-level cell) of the SLC memory is referred to as a program process, and may change a threshold voltage of the memory cell. For example, when data of a logic value of "1" is stored in the single-level cell, the single-level cell may have a threshold voltage of 1.0 V, and when data of a logic value of "0" is stored in the single-level cell, the single-level cell may have a threshold voltage of 3.0 V.

The threshold voltage generated in each single-level cell where the same data is programmed may have a distribution within a predetermined range due to a minute electrical characteristic difference between single-level cells. For example, when a voltage read from the memory cell is higher than or equal to 0.5 V and is lower than 1.5 V, it may be determined that the data stored in the memory cell has a logic value of "1". When the voltage read from the memory cell is higher than or equal to 2.5 V and is lower than 3.5 V, it may be determined that the data stored in the memory cell has a logic value of "0". The data stored in the memory cell may be classified depending on the difference between currents/voltages of the memory cell during the reading operations.

Meanwhile, a multi-level cell (MLC) memory device that can store data of two or more bits in a single memory cell has been proposed in response to a need for higher integration of memory. The MLC memory device is also referred to as a multi-bit cell (MBC) memory. However, as the number of bits programmed in the single memory cell increases, reliability may deteriorate and a read-failure rate may increase. To program 'm' bits in the single memory cell, any one of $2^m$ threshold voltages may need to be generated in the memory cell. Threshold voltages of memory cells where the same data is programmed may generate a distribution within a predetermined range due to the minute electrical characteristic difference between the memory cells. Each threshold voltage distribution may correspond to each of $2^m$ data values generated by 'm' bits.

However, since a voltage window for a memory device may be limited, a distance between $2^m$ distributions of threshold voltages between adjacent bits may decrease as 'm' increases, and the distributions may be overlapped as the distance between the distributions decreases. When the distributions are overlapped, the read-failure rate may increase.

SUMMARY

Example embodiments may provide apparatuses and/or methods that may use a new programming method, thereby reducing a width of a distribution of threshold voltages of a memory cell.

Example embodiments also may provide apparatuses and/or methods that may use a new programming method, thereby reducing an error when data is read from a memory cell.

According to example embodiments, a memory device may include: a memory cell array including a plurality of memory cells; a programming unit configured to apply a plurality of pulses corresponding to a program voltage to a gate terminal of each of the plurality of memory cells, and to apply a program condition voltage to a bit line connected with a memory cell having a threshold voltage lower than a verification voltage from among the plurality of memory cells; and a control unit configured to increase the program voltage during a first time interval by a first increment for each pulse, and to increase the program voltage during a second time interval by a second increment for each pulse.

According to example embodiments, a memory programming method may include: applying a pulse corresponding to a program voltage to a gate terminal of each of a plurality of memory cells; applying a program condition voltage to a bit line connected with a memory cell having a threshold voltage lower than a verification voltage from among the plurality of memory cells while the pulse is applied; determining an increment of the program voltage after the pulse is applied; increasing the program voltage by the determined increment; and applying the pulse corresponding to the increased program voltage to a gate terminal of each of the plurality of memory cells.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 10 is a flowchart illustrating another example of the determination of the increment of the program voltage in operation S840 of FIG. 8; and FIG. 11 is a flowchart illustrating still another example of the determination of the increment of the program voltage in operation S840 of FIG. 8.

DETAILED DESCRIPTION OF EXAMPLE EMBODIMENTS

Figure 1:
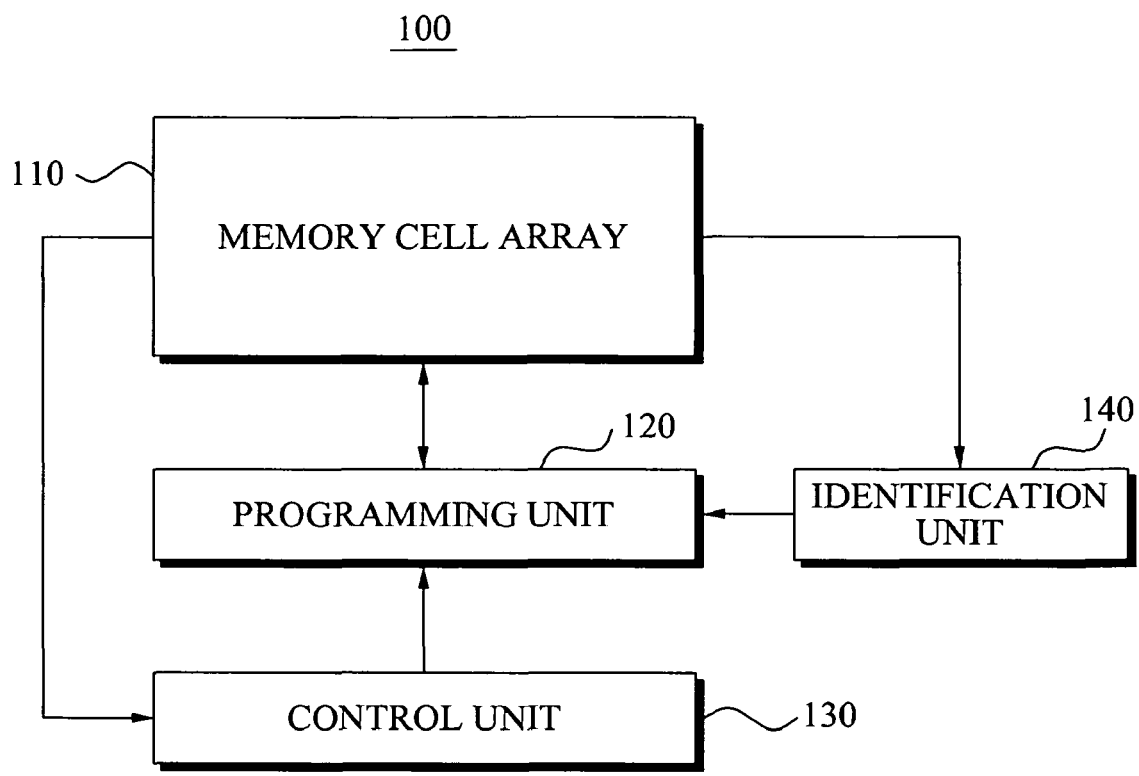
FIG. 1 is a block diagram illustrating a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will herein be described in detail. It should be understood, however, that there is not intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made to example embodiments, which are illustrated in the accompanying drawings, wherein like reference numerals may refer to like components throughout.

FIG. 1 is a block diagram illustrating a memory device 100 according to example embodiments.

Referring to FIG. 1, the memory device 100 may include a memory cell array 110, a programming unit 120, and a control unit 130, and may further include an identification unit 140.

The memory cell array 110 may include a plurality of memory cells. The programming unit 120 may change a threshold voltage of each of the plurality of memory cells to store data in each of the plurality of memory cells.

A process of changing a threshold voltage of a memory cell to store the data may be referred to as programming. The memory device 100 may set a target threshold voltage section of the memory cell based on the data stored in the memory cell. The programming unit 120 may change the threshold voltage of the memory cell to enable the threshold voltage of the memory cell to be included in the set target threshold voltage section.

For example, the memory device 100 may set the target threshold voltage section being higher than or equal to 1 V and being lower than or equal to 2 V with respect to the memory cell storing data "1", and may set the target threshold voltage section of being higher than or equal to 3 V and being lower than or equal to 4 V with respect to the memory cell storing data "0".

The programming unit 120 may change the threshold voltage of the memory cell storing data "1" to enable the threshold voltage of the memory cell storing data "1" to be included in the target threshold voltage section of being higher than or equal to 1 V and being lower than or equal to 2 V. The programming unit 120 may change the threshold voltage of the memory cell storing data "0" to enable the threshold voltage of the memory cell storing data "0" to be included in the target threshold voltage section of being higher than or equal to 3 V and being lower than or equal to 4 V.

Depending on embodiments, the programming unit 120 may change the threshold voltage of the memory cell using comparison with a verification voltage. The memory device 100 may set the verification voltage with respect to the memory cell based on the data stored in the memory cell.

For example, the memory device 100 may set the verification voltage of 1 V with respect to the memory cell storing data "1", and may set the verification voltage of 3 V with respect to the memory cell storing data "0". The programming unit 120 may change the threshold voltage of the memory cell storing data "1" to enable the memory cell storing data "1" to have the threshold voltage higher than the verification voltage of 1 V. The programming unit 120 may change the threshold voltage of the memory cell storing data "0" to enable the memory cell storing data "0" to have the threshold voltage higher than the verification voltage of 3 V.

The programming unit 120 may apply a condition voltage of changing the threshold voltage of the memory cell during a predetermined time interval to the memory cell. The programming unit 120 may compare the threshold voltage of the memory cell after the predetermined time interval and the verification voltage or the target threshold voltage section, and may stop a threshold voltage change with respect to the memory cell when the threshold voltage of the memory cell is higher than the verification voltage or is included in the target threshold voltage section.

When the memory cell corresponds to a multi-bit cell storing multi-bit data, the memory device 100 may store m-bit data using $2^m$ verification voltage levels or $2^m$ target threshold voltage sections. The memory device 100 may set $2^m$ verification voltage levels, and may select any one of $2^m$ verification voltage levels based on the data stored in the memory cell. The programming unit 120 may change the threshold voltage of the memory cell using the selected verification voltage level.

The memory cell of the memory device 100 may include a control gate (CG) and a floating gate (FG), an insulator may be inserted between the CG and the FQ and the insulator may be inserted between the FG and a substrate.

A programming process of storing the data in the memory cell or a process of erasing the data stored in the memory cell may be performed by a hot carrier effect (HCE) or a Fowler-Nordheim Tunneling (F-N tunneling) mechanism.

Under a specific bias condition, a channel may be generated in an area closest to the FG of a substrate area. The channel corresponds to an area in which minority carriers of the substrate area are accumulated and generated, and the memory device 100 may control the minority carriers to program the data in the memory cell or to erase the data stored in the memory cell.

When a specific bias is applied to a source, a drain, and the CG of the substrate area, the minority carriers of the channel may move to the FG Example mechanisms by which the minority carriers of the channel move to the FG include, for example, the HCE and F-N tunneling.

The memory cells storing the same data may be programmed by the same target threshold voltage section or the same verification voltage. Since minute electrical differences between each of the memory cells may exist, the threshold voltage of the memory cells storing the same data may generate a distribution having a little range.

The programming process with respect to the memory cell may affect the threshold voltage of the peripheral memory cell undesirably. An example of a cause for this may include FG coupling or program disturbance.

FG coupling may denote a phenomenon wherein, for example, the threshold voltage of the central memory cell is affected by a change amount of the threshold voltage of the peripheral memory cells. The threshold voltage of the central memory cell may be affected by coupling of a parasitic capacitance between FGs of the memory cells.

When the programming process increases the threshold voltage, the threshold voltage of the central memory cell may increase more than a desired value due to FG coupling. The distribution of threshold voltages of the memory cells may show a tendency to spread due to the mechanism, for example FG coupling.

Since a voltage window at which the memory cell operates may be limited, a possibility of overlapping the distribution of threshold voltages may increase as the distribution of threshold voltages spreads. As a degree of overlapping of the distribution of threshold voltages increases, an error rate of not reading the programmed data accurately may increase. When the memory cell corresponds to the multi-bit cell storing m-bit data, the threshold voltage of the memory cells of the memory cell array 110 may generate $2^m$ distributions. As 'm' increases, the error rate may increase due to undesired spread of the distribution.

The program disturbance may denote a phenomenon wherein, for example, the threshold voltage of the peripheral memory cell is affected by a program condition voltage programmed in the memory cell. The threshold voltage of the memory cell may be affected undesirably by the program disturbance during programming.

Causes for the threshold voltage of the memory cells to undergo the undesired change over time may include a charge loss and the like.

The HCE may move many carriers to the FG faster than F-N tunneling, however, the HCE may cause a relatively great amount of physical damage to the insulator between the FG and the substrate. F-N tunneling may cause relatively little damage to the insulator, however, when a number of times of programming the data in the memory cell and erasing the data stored in the memory cell increases, this damage may be non-negligible.

When a carrier is accumulated in the FG and a charge is generated, the data of the memory cell may be determined based on the generated charge. When the physical damage is caused to the insulator around the FQ, a leaking path of the carrier may be formed in the insulator.

The charge being charged in the FG may need to be maintained in the FG before a discharge condition is fulfilled. However, the charge being charged in the FG may peripherally spread due to a natural spread phenomenon, and the charge being charged in the FG may be lost when the insulator around the FG is damaged and the leaking path of the charge is generated. The mechanism of losing the charge being charged in the FG may tend to reduce the threshold voltage of the memory cell.

The process of programming the data in the memory cell may require a time longer than the process of reading the data from the memory cell. Since the process of programming the data in the memory cell may require a relatively long time, the memory device 100 may simultaneously program the data in the plurality of memory cells to reduce a programming time of the entire data. A set of the simultaneously-programmed memory cells is referred to as a page for convenience of description. For example, a single page may include 1000 memory cells, and the memory cell array 110 may include 1000 pages.

According to example embodiments, the programming unit 120 may simultaneously program the data in the memory cells connected with a single word line. The word line may be connected with a gate terminal of each of the memory cells included in a single page.

The memory device 100 may select the page corresponding to a memory address corresponding to the data to be stored, and may select the word line connected with the memory cells included in the selected page. The programming unit 120 may apply the program voltage to the selected word line to enable the memory cells included in the selected page to reach a program preparation state.

The programming unit 120 may apply a plurality of pulses corresponding to the program voltage to the gate terminal of each of the plurality of memory cells. The programming unit 120 may apply the program condition voltage to a bit line connected with the memory cell having the threshold voltage lower than the verification voltage from among the plurality of memory cells. The programming unit 120 may apply a program inhibit voltage to the bit line connected with the memory cell having the threshold voltage higher than or equal to the verification voltage from among the plurality of memory cells. While a programming operation is performed, the threshold voltage of the memory cell connected with the bit line to which the program inhibit voltage is applied may not be changed or may have a very small degree of change.

The control unit 130 may increase the program voltage during a first time interval by a first increment for each pulse, and may increase the program voltage during a second time interval by a second increment for each pulse.

The programming unit 120 may apply the pulse corresponding to the program voltage to the gate terminal of each of the memory cells included in the page during the first time interval at least once. The identification unit 140 may identify the memory cell having the threshold voltage lower than a first verification voltage from among the memory cells included in the page each time after the pulse is applied. The programming unit 120 may apply the program condition voltage to the bit line connected with the identified memory cell while the pulse corresponding to the program voltage is applied.

Figure 2:
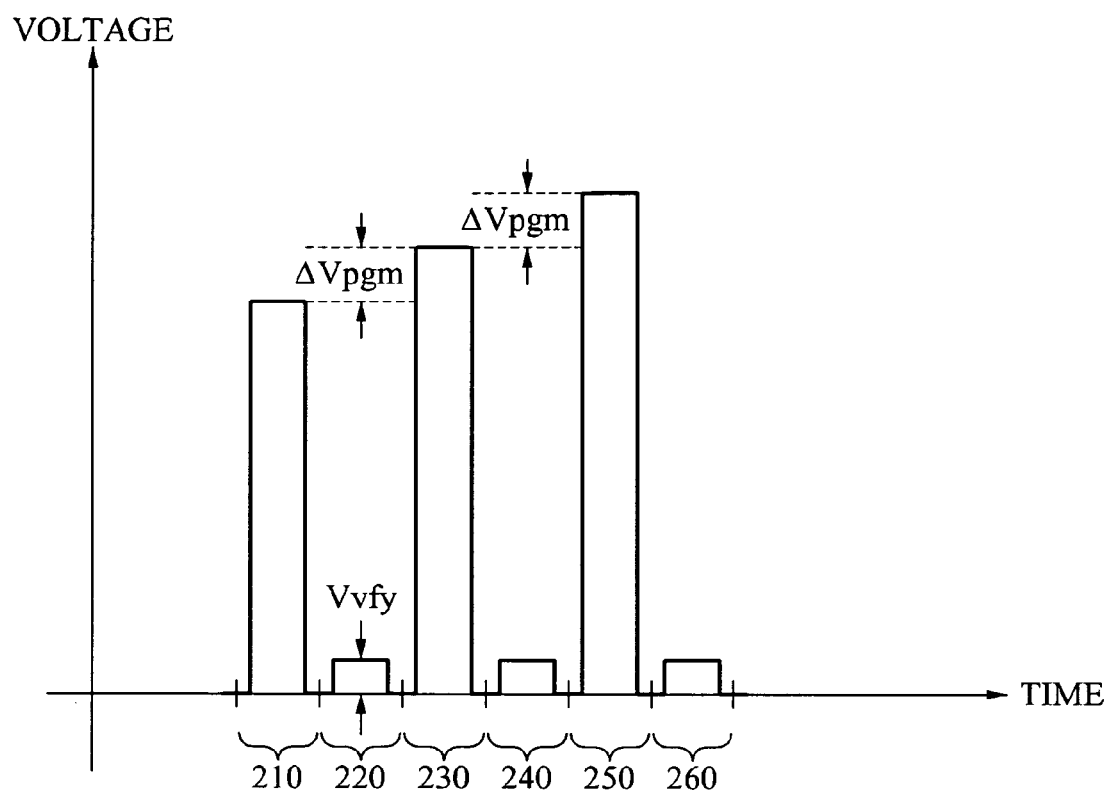
FIG. 2 illustrates an operation of the memory device of FIG. 1 according to example embodiments.

FIG. 2 illustrates an operation of the memory device 100 of FIG. 1.

Referring to FIG. 2, a voltage applied to a gate terminal of a memory cell included in a selected page over time is illustrated.

The programming unit 120 may apply a pulse corresponding to a program voltage Vpgm(1) to the gate terminal of the memory cell included in the selected page during a time interval 210. According to example embodiments, the selected page may be a set of memory cells connected with a single word line, and the word line may be connected with the gate terminal of each of the memory cells included in the selected page. The programming unit 120 may apply the pulse corresponding to the program voltage Vpgm(1) to the gate terminal of the memory cell included in the selected page through the word line.

The memory device 100 may apply the pulse corresponding to a verification voltage Vvfy to the gate terminal of the memory cell included in the selected page during a time interval 220. The memory device 100 may sense a voltage or a current of a bit line connected with the memory cell included in the selected page to decide whether a threshold voltage of the memory cell included in the selected page is higher than the verification voltage Vvfy. The memory device 100 may identify the memory cell having the threshold voltage lower than the verification voltage Vvfy from among a plurality of memory cells included in the selected page.

The programming unit 120 may apply the pulse corresponding to a program voltage Vpgm(2)=Vpgm(1)+ΔVpgm to the gate terminal of the memory cell included in the selected page during a time interval 230. A programming process of sequentially increasing the voltage corresponding to the applied pulse is referred to as an Incremental Step Pulse Program (ISPP). The programming unit 120 may apply a program condition voltage to the bit line connected with the identified memory cell during the previous time interval 220.

The memory device 100 may apply the pulse corresponding to the verification voltage Vvfy to the gate terminal of the memory cell included in the selected page during a time interval 240. The memory device 100 may decide whether the threshold voltage of the memory cell included in the selected page is higher than the verification voltage Vvfy. The memory device 100 may identify the memory cell having the threshold voltage higher than or equal to the verification voltage Vvfy due to the pulse applied during the previous time interval 230 from among the plurality of memory cells included in the selected page.

The programming unit 120 may apply the pulse corresponding to a program voltage Vpgm(3)=Vpgm(1)+2ΔVpgm to the gate terminal of the memory cell included in the selected page during a time interval 250. The programming unit 120 may apply the program condition voltage to the bit line connected with the memory cell decided to have the threshold voltage lower than the verification voltage Vvfy during the previous time interval 240. The memory device 100 may apply the pulse corresponding to the verification voltage Vvfy to the gate terminal of the memory cell included in the selected page during a time interval 260.

A process during which the programming unit 120 applies the pulse corresponding to the program voltage and applies the pulse corresponding to the verification voltage Vvfy is referred to as a single loop in the present specification. The loop is also referred to as a program loop and is also referred to as a unit programming operation.

The memory cell in which the threshold voltage quickly changes is referred to as a fast cell, and the memory cell in which the threshold voltage slowly changes is referred to as a slow cell from among the memory cells to which the program condition voltage is applied.

Figure 3:
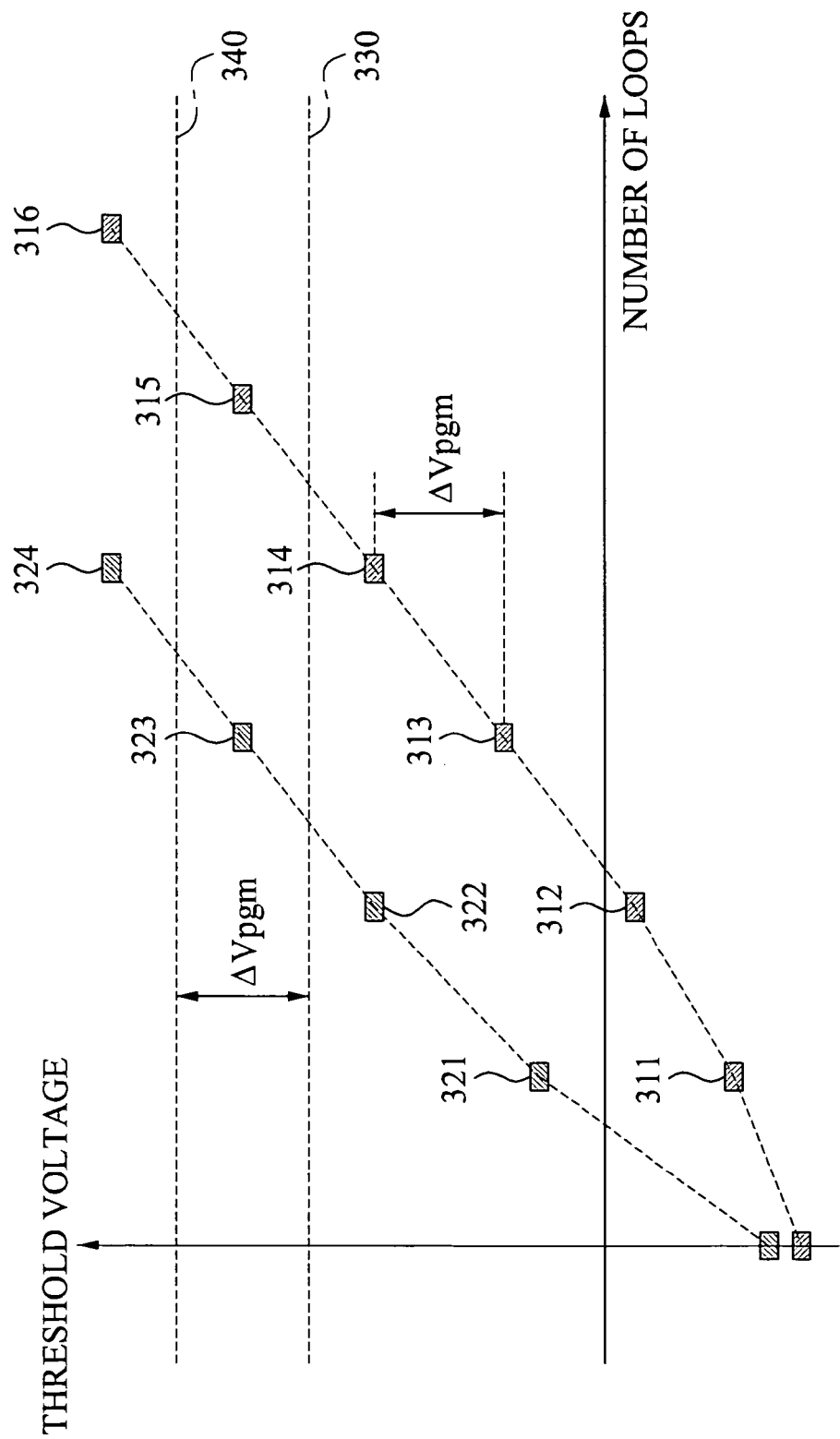
FIG. 3 illustrates a change of threshold voltages of a fast cell and a slow cell from among a plurality of memory cells of the memory device of FIG. 1 according to example embodiments.

FIG. 3 illustrates a change of threshold voltages of a fast cell and a slow cell from among a plurality of memory cells of the memory device 100 of FIG. 1.

Referring to FIG. 3, the change of threshold voltages of the fast cell and the slow cell based on a number of times of performing of a loop is illustrated.

A threshold voltage of the fast cell may reach a state 321 after a first loop is performed. The threshold voltage of the slow cell may reach a state 311 after the first loop is performed.

The threshold voltage of the fast cell may relatively quickly change when the number of times of the performing of the loop is small, and may increase by an increment of a program voltage ΔVpgm when the number of times of the performing of the loop is greater than or equal to a certain number of times. The threshold voltage of the slow cell may relatively slowly change when the number of times of the performing of the loop is small, and may increase by the increment of the program voltage ΔVpgm when the number of times of the performing of the loop is greater than or equal to the certain number of times.

A state where the threshold voltage of the memory cell increases by the increment of the program voltage ΔVpgm of an ISPP process may be referred to as a balanced state.

The threshold voltage of the fast cell may reach a state 322 after a second loop is performed. The threshold voltage of the slow cell may reach a state 312 after the second loop is performed.

The change of threshold voltages of the fast cell due to the second loop may be greater than ΔVpgm and the change of threshold voltages of the slow cell due to the second loop is less than ΔVpgm. The fast cell and the slow cell may be regarded as not reaching the balanced state after the second loop is performed.

The threshold voltage of the fast cell may reach a state 323 after a third loop is performed. The threshold voltage of the slow cell may reach a state 313 after the third loop is performed.

The change of threshold voltages of the fast cell due to the third loop may correspond to ΔVpgm, and the change of threshold voltages of the slow cell due to the third loop may also correspond to ΔVpgm. The fast cell and the slow cell may be regarded as reaching the balanced state after the third loop is performed.

The threshold voltage of the fast cell may reach a state 324 after a fourth loop is performed. The threshold voltage of the slow cell may reach a state 314 after the fourth loop is performed.

The change of threshold voltages of the fast cell due to the fourth loop may correspond to ΔVpgm, and the change of threshold voltages of the slow cell due to the fourth loop may also correspond to ΔVpgm. The fast cell and the slow cell may be regarded as maintaining the balanced state after the third loop is performed.

The threshold voltage of the slow cell may reach a state 315 after a fifth loop is performed. The threshold voltage of the slow cell may reach a state 316 after a sixth loop is performed.

Referring to FIG. 1 again, the memory device 100 may regard a time interval before the plurality of memory cells reaches the balanced state as a first time interval, and may set the increment of the program voltage of the ISPP process as a first increment. The memory device 100 may regard a time interval after the plurality of memory cells reaches the balanced state as a second time interval, and may set the increment of the program voltage of the ISPP process as a second increment.

Depending on embodiments, the memory device 100 may determine that the plurality of memory cells reaches the balanced state and may terminate the first time interval after applying the pulse corresponding to the program voltage at a certain number of times 'N'. The memory device 100 may monitor an increase change of the threshold voltage of the memory cell based on a number of loops to determine the certain number of times 'N'. The memory device 100 may store a number of applications of the pulse corresponding to the program voltage.

Referring to FIGS. 1 and 3, the memory device 100 may set a first decision voltage 330 and a second decision voltage 340. The memory device 100 may count a number of memory cells having the threshold voltage higher than or equal to the first decision voltage 330 each time after the pulse is applied. The memory device 100 may count a number of memory cells having the threshold voltage higher than or equal to the second decision voltage 340 each time after the pulse is applied. The second decision voltage 340 is higher than the first decision voltage 330 by ΔVpgm.

According to example embodiments, the control unit 130 may set, as a first number, a number of memory cells having the threshold voltage being higher than or equal to the first decision voltage 330 and being lower than the second decision voltage 340 each time after the pulse is applied. The control unit 130 may set, as a second number, a number of memory cells having the threshold voltage being higher than or equal to the second decision voltage 340 each time after the pulse is applied. The control unit 130 may compare the first number and the second number to determine whether the plurality of memory cells reaches the balanced state each time after the pulse is applied.

When the first number is equal to the second number or when a difference between the first number and the second number is less than a reference value, the control unit 130 may regard that the plurality of memory cells reaches the balanced state.

According to example embodiments, the control unit 130 may set, as a third number, a number of memory cells having the threshold voltage being higher than or equal to the first decision voltage 330 after the loop is performed three times.

The control unit 130 may set, as a fourth number, a number of memory cells having the threshold voltage being higher than or equal to the second decision voltage 340 after the loop is performed four times.

When the third number is equal to the fourth number or when a difference between the third number and the fourth number is less than the reference value, the control unit 130 may regard that the plurality of memory cells reaches the balanced state after the loop is performed four times.

Figure 4:
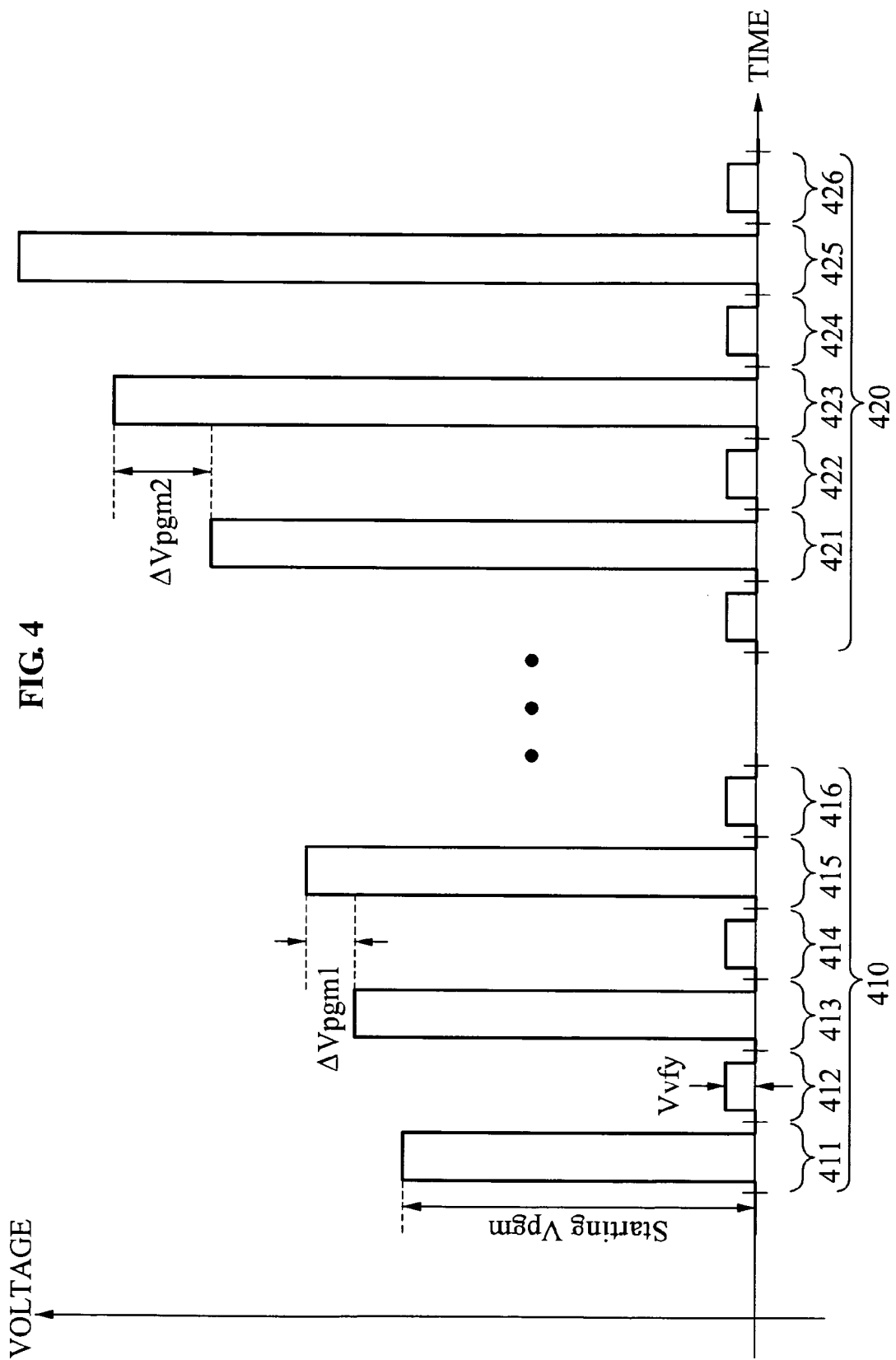
FIG. 4 illustrates another operation of the memory device of FIG. 1 according to example embodiments.

FIG. 4 illustrates another operation of the memory device 100 of FIG. 1 according to example embodiments.

Referring to FIG. 4, a voltage applied to a gate terminal of a memory cell included in a selected page over time is illustrated.

A first time interval 410 may include six time intervals 411 through 416.

The programming unit 120 may apply a pulse corresponding to a program voltage Vpgm to the gate terminal of the memory cell included in the selected page during a time interval 411.

The programming unit 120 may apply a pulse corresponding to a verification voltage Vvfy to the gate terminal of the memory cell included in the selected page during a time interval 412. The memory device 100 may identify the memory cell having the threshold voltage lower than the verification voltage Vvfy from among a plurality of memory cells included in the selected page.

The programming unit 120 may apply the pulse corresponding to a program voltage Vpgm+ΔVpgm1 to the gate terminal of the memory cell included in the selected page during a time interval 413.

The memory device 100 may apply the pulse corresponding to the verification voltage Vvfy to the gate terminal of the memory cell included in the selected page during a time interval 414. The memory device 100 may decide whether the threshold voltage of the memory cell included in the selected page is higher than the verification voltage Vvfy. The memory device 100 may identify the memory cell having the threshold voltage higher than or equal to the verification voltage Vvfy due to the pulse applied during the previous time interval 413 from among the plurality of memory cells included in the selected page.

The programming unit 120 may apply the pulse corresponding to a program voltage Vpgm+2ΔVpgm1 to the gate terminal of the memory cell included in the selected page during a time interval 415. The programming unit 120 may apply the program condition voltage to the bit line connected with the memory cell decided to have the threshold voltage lower than the verification voltage Vvfy during the previous time interval 414. The memory device 100 may apply the pulse corresponding to the verification voltage Vvfy to the gate terminal of the memory cell included in the selected page during a time interval 416.

A second time interval 420 may include six time intervals 421 through 426.

The programming unit 120 may apply the pulse corresponding to a program voltage Vpgm2 to the gate terminal of the memory cell included in the selected page during a time interval 421.

The memory device 100 may apply the pulse corresponding to the verification voltage Vvfy to the gate terminal of the memory cell included in the selected page during a time interval 422. The memory device 100 may identify the memory cell having the threshold voltage lower than the verification voltage Vvfy from among the plurality of memory cells included in the selected page.

The programming unit 120 may apply the pulse corresponding to a program voltage Vpgm2+ΔVpgm2 to the gate terminal of the memory cell included in the selected page during a time interval 423. The memory device 100 may apply the pulse corresponding to the verification voltage Vvfy to the gate terminal of the memory cell included in the selected page during a time interval 424. The memory device 100 may decide whether the threshold voltage of the memory cell included in the selected page is higher than the verification voltage Vvfy. The memory device 100 may identify the memory cell having the threshold voltage higher than or equal to the verification voltage Vvfy due to the pulse applied during the previous time interval 423 from among the plurality of memory cells included in the selected page.

The programming unit 120 may apply the pulse corresponding to a program voltage Vpgm2+2ΔVpgm2 to the gate terminal of the memory cell included in the selected page during a time interval 425. The programming unit 120 may apply the program condition voltage to the bit line connected with the memory cell decided to have the threshold voltage lower than the verification voltage Vvfy during the previous time interval 424. The memory device 100 may apply the pulse corresponding to the verification voltage Vvfy to the gate terminal of the memory cell included in the selected page during a time interval 426.

The memory device 100 of FIG. 1 may set a first increment ΔVpgm1 to be less than a second increment of an ISPP, ΔVpgm2. The memory device 100 may set the first increment ΔVpgm1 before the plurality of memory cells reaches the balanced state as a value less than ΔVpgm2, thereby enabling the fast cell from among the plurality of memory cells not to be overprogrammed.

The memory device 100 of FIG. 1 may set the first increment ΔVpgm1 as the value being less than ΔVpgm2 and may set a start program voltage Vpgm as a relatively high value. The memory device 100 may set the start program voltage Vpgm as the relatively high value based on a number of loops that increases as the first increment ΔVpgm is set as a low value.

Figure 5:
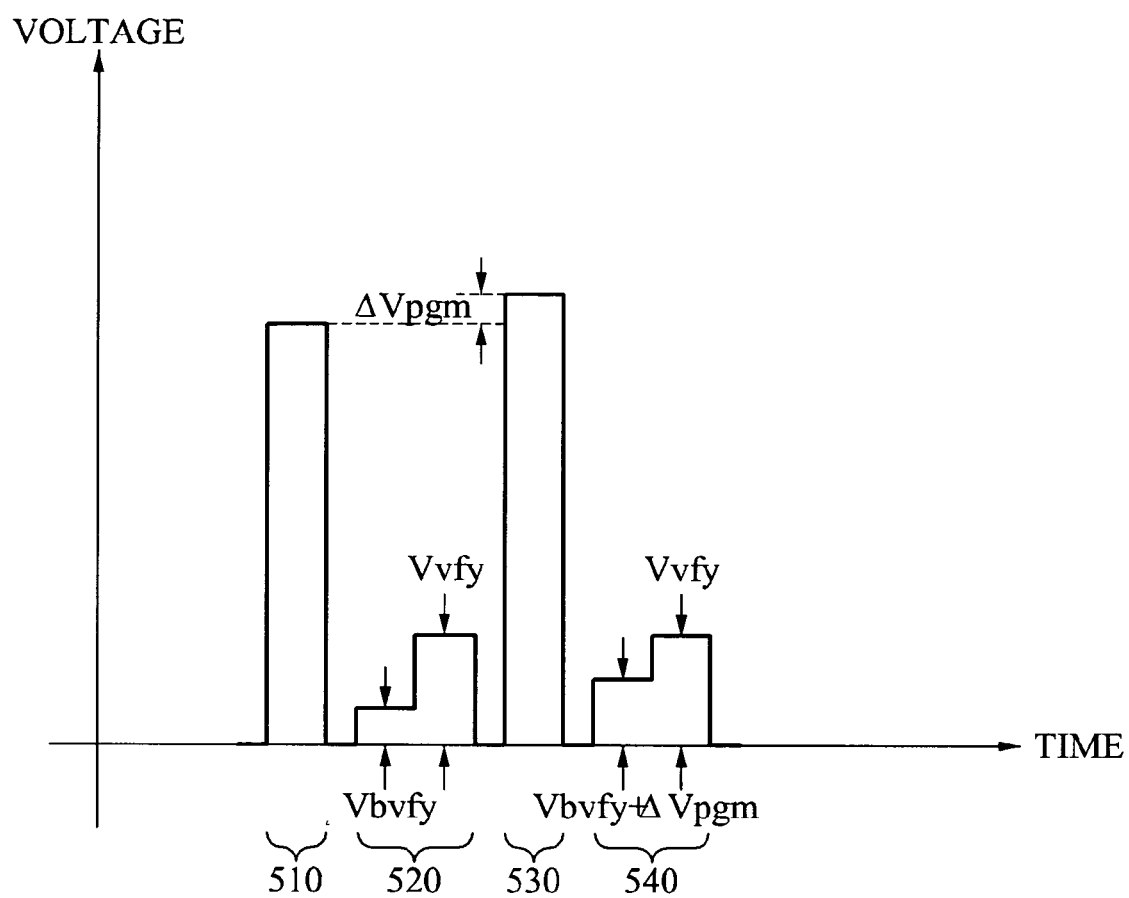
FIG. 5 illustrates still another operation of the memory device of FIG. 1 according to example embodiments.

FIG. 5 illustrates still another operation of the memory device 100 of FIG. 1.

Referring to FIG. 5, a voltage applied to a gate terminal of a memory cell included in a selected page over time is illustrated.

The programming unit 120 may apply a pulse corresponding to a program voltage to the gate terminal of the memory cell included in the selected page during a time interval 510.

The memory device 100 may apply a first decision voltage Vbvfy to the gate terminal of the memory cell included in the selected page during a time interval 520. The memory device 100 may identify the memory cell having the threshold voltage higher than or equal to the first decision voltage Vbvfy from among a plurality of memory cells included in the selected page. The memory device 100 may store, as a first number, a number of memory cells having the threshold voltage higher than or equal to the first decision voltage Vbvfy.

The memory device 100 may apply a verification voltage Vvfy after the first decision voltage Vbvfy is applied. The memory device 100 may identify the memory cell having the threshold voltage lower than the verification voltage Vvfy from among the plurality of memory cells included in the selected page.

The programming unit 120 may apply the pulse corresponding to a program voltage increased by ΔVpgm to the gate terminal of the memory cell included in the selected page during a time interval 530.

The memory device 100 may apply the increased first decision voltage Vbvfy+ΔVpgm to the gate terminal of the memory cell included in the selected page during a time interval 540. The memory device 100 may identify the memory cell having the threshold voltage higher than or equal to the increased first decision voltage Vbvfy+ΔVpgm from among the plurality of memory cells included in the selected page. The memory device 100 may store, as a second number, a number of memory cells having the threshold voltage higher than or equal to the increased first decision voltage Vbvfy+ΔVpgm.

The memory device 100 may apply a verification voltage Vvfy after the increased first decision voltage Vbvfy+ΔVpgm is applied. The memory device 100 may identify the memory cell having the threshold voltage lower than the verification voltage Vvfy from among a plurality of memory cells included in the selected page.

The memory device 100 may compare the stored first number and the stored second number to determine whether the plurality of memory cells reaches a balanced state. The memory device 100 may regard that the plurality of memory cells reaches the balanced state when the stored first number is equal to the stored second number.

Figure 6:
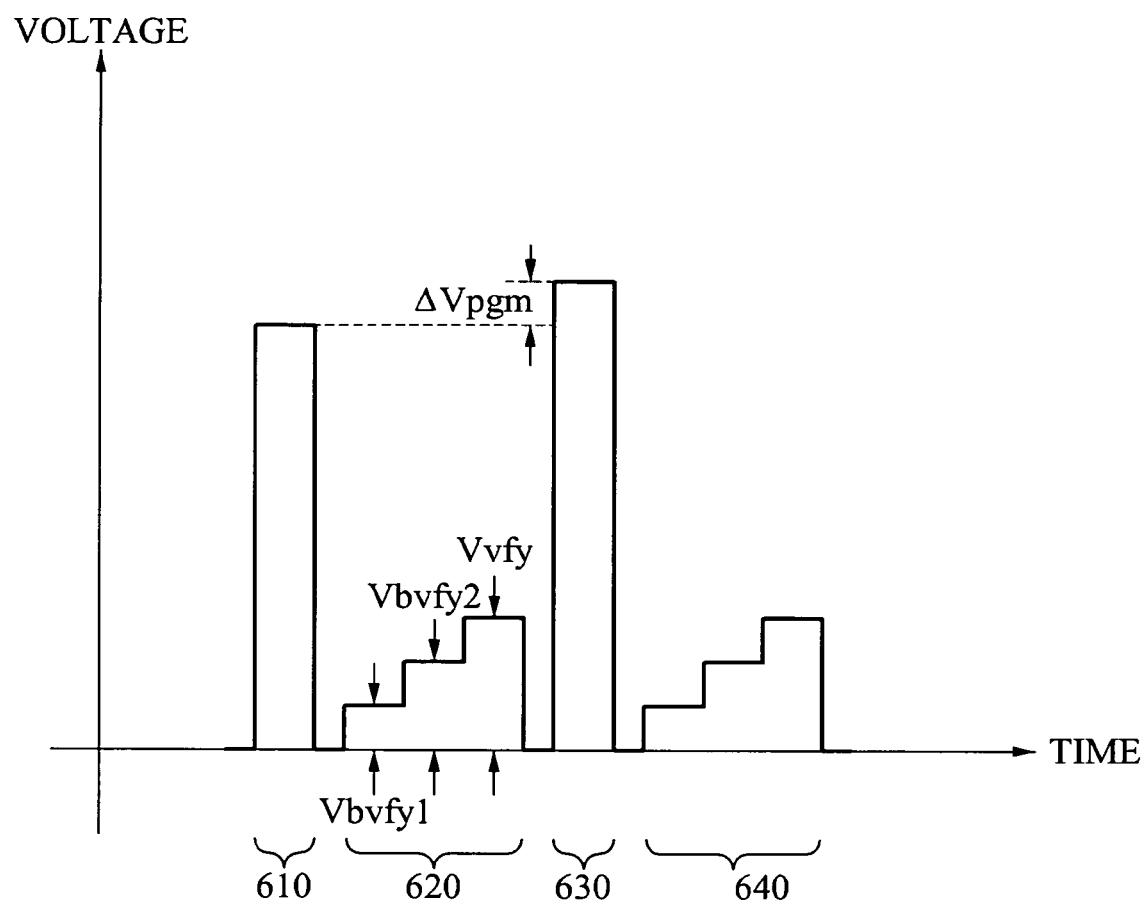
FIG. 6 illustrates yet another operation of the memory device of FIG. 1 according to example embodiments.

FIG. 6 illustrates yet another operation of the memory device 100 of FIG. 1.

Referring to FIG. 6, a voltage applied to a gate terminal of a memory cell included in a selected page over time is illustrated.

The programming unit 120 may apply a pulse corresponding to a program voltage to the gate terminal of the memory cell included in the selected page during a time interval 610.

The memory device 100 may apply a first decision voltage Vbvfy1 to the gate terminal of the memory cell included in the selected page during a time interval 620. The memory device 100 may apply a second decision voltage Vbvfy2 after the first decision voltage Vbvfy1 is applied. The second decision voltage Vbvfy2 may correspond to a voltage of increasing the first decision voltage Vbvfy1 by ΔVpgm.

The memory device 100 may identify the memory cell having the threshold voltage being higher than or equal to the first decision voltage Vbvfy1 and being lower than the second decision voltage Vbvfy2 from among a plurality of memory cells included in the selected page. The memory device 100 may store, as a first number, a number of memory cells having the threshold voltage being higher than or equal to the first decision voltage Vbvfy1 and being lower than the second decision voltage Vbvfy2.

The memory device 100 may identify the memory cell having the threshold voltage being higher than or equal to the second decision voltage Vbvfy2 from among the plurality of memory cells included in the selected page. The memory device 100 may store, as a second number, a number of memory cells having the threshold voltage being higher than or equal to the second decision voltage Vbvfy2.

The memory device 100 may apply a verification voltage Vvfy after the second decision voltage Vbvfy2 is applied. The memory device 100 may identify the memory cell having the threshold voltage lower than the verification voltage Vvfy from among the plurality of memory cells included in the selected page.

The programming unit 120 may apply the pulse corresponding to the program voltage increased by ΔVpgm to the gate terminal of the memory cell included in the selected page during a time interval 630.

The memory device 100 may sequentially apply the first decision voltage Vbvfy1, the second decision voltage Vbvfy2, and the verification voltage Vvfy to the gate terminal of the memory cell included in the selected page during a time interval 640.

The memory device 100 may update the first number and the second number during the time interval 640.

Since the threshold voltage of the plurality of memory cells increases due to the pulse applied during the time interval 630, the first number and the second number stored during the time interval 640 may be greater than the first number and the second number stored during the time interval 630. The memory device 100 may compare an increment of the first number and an increment of the second number to determine whether the plurality of memory cells reaches a balanced state. When the increment of the first number is equal to the increment of the second number, the memory device 100 may regard that the plurality of memory cells reaches the balanced state.

Figure 7:
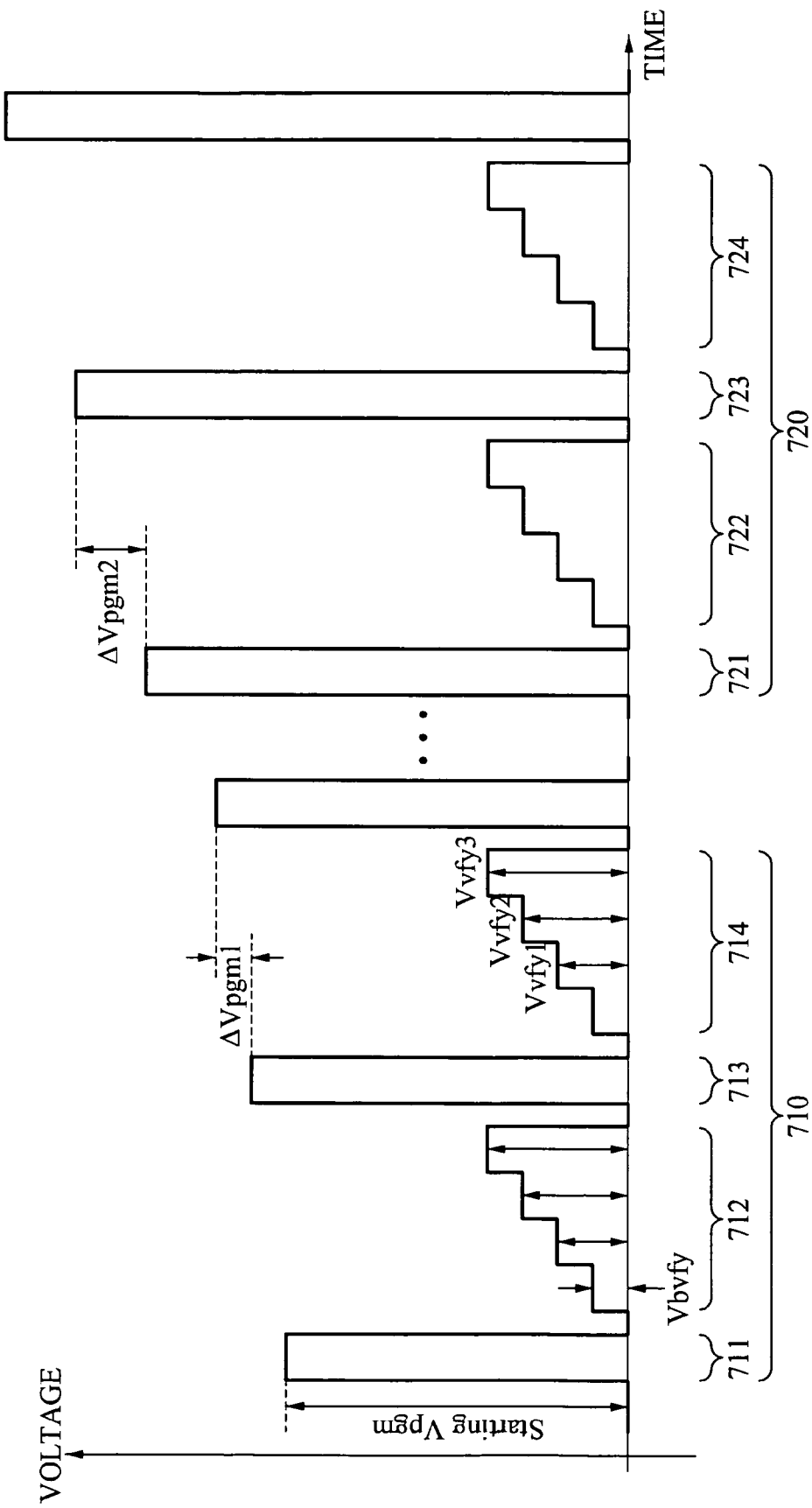
FIG. 7 illustrates a further operation of the memory device of FIG. 1 according to example embodiments.

FIG. 7 illustrates a further operation of the memory device 100 of FIG. 1.

Referring to FIG. 7, a voltage applied to a gate terminal of a memory cell included in a selected page over time is illustrated.

A first time interval 710 may include four time intervals 711 through 714.

The programming unit 120 may apply a pulse corresponding to a program voltage Vpgm to the gate terminal of the memory cell included in the selected page during a time interval 711.

The memory device 100 may sequentially apply a first decision voltage Vbvfy and three verification voltages Vvfy1, Vvfy2, and Vvfy3 to the gate terminal of the memory cell included in the selected page during a time interval 712.

The memory device 100 may set the verification voltage with respect to each of the plurality of memory cells based on data to be programmed in the plurality of memory cells. For example, when a memory cell corresponds to a multi-bit cell storing 2-bit data, the memory device 100 may set the verification voltage Vvfy1 in the memory cell in which data "10" is programmed. The memory device 100 may set the verification voltage Vvfy2 in the memory cell in which data "01" is programmed, and may set the verification voltage Vvfy3 in the memory cell in which data "00" is programmed.

The memory device 100 may compare the first decision voltage Vbvfy and the threshold voltage of each of the plurality of memory cells to count a number of memory cells having the threshold voltage higher than or equal to the first decision voltage Vbvfy. The memory device 100 may determine whether the plurality of memory cells reaches a balanced state based on the number of memory cells having the threshold voltage higher than or equal to the first decision voltage Vbvfy.

The memory device 100 may decide whether the threshold voltage of the memory cell in which data "10" is programmed is higher than or equal to the verification voltage Vvfy1, may decide whether the threshold voltage of the memory cell in which data "01" is programmed is higher than or equal to the verification voltage Vvfy2, and may decide whether the threshold voltage of the memory cell in which data "00" is programmed is higher than or equal to the verification voltage Vvfy3.

The programming unit 120 may apply the pulse corresponding to a program voltage Vpgm+ΔVpgm1 to the gate terminal of the memory cell included in the selected page during a time interval 713.

The memory device 100 may sequentially apply the first decision voltage Vbvfy and the three verification voltages Vvfy1, Vvfy2, and Vvfy3 to the gate terminal of the memory cell included in the selected page during a time interval 714.

A second time interval 720 may include four time intervals 721 through 724.

The programming unit 120 may apply the pulse corresponding to the program voltage to the gate terminal of the memory cell included in the selected page during a time interval 721.

The memory device 100 may sequentially apply the first decision voltage Vbvfy and the three verification voltages Vvfy1, Vvfy2, and Vvfy3 to the gate terminal of the memory cell included in the selected page during a time interval 722.

The programming unit 120 may apply the pulse corresponding to the program voltage increased by ΔVpgm2 to the gate terminal of the memory cell included in the selected page during a time interval 723.

The memory device 100 may sequentially apply the first decision voltage Vbvfy and the three verification voltages Vvfy1, Vvfy2, and Vvfy3 to the gate terminal of the memory cell included in the selected page during a time interval 724.

The memory device 100 may program a plurality of data using the same loop. The data corresponding to the lower threshold voltages may be programmed earlier than the data corresponding to the higher threshold voltages. The data corresponding to the lower threshold voltages may be programmed by the pulse of increasing by a first increment ΔVpgm1, and the data corresponding to the higher threshold voltages may be programmed by the pulse of increasing by a second increment ΔVpgm2.

When a distribution generated by the threshold voltages of the memory cells storing the data corresponding to the lower threshold voltages is referred to as a first distribution, and a distribution generated by the threshold voltages of the memory cells storing the data corresponding to the higher threshold voltages is referred to as a second distribution, a width of the first distribution may be less than or equal to a width of the second distribution.

The memory device 100 may reduce the width of the distributions generated by the threshold voltages of the memory cells storing the data corresponding to the lower threshold voltage.

The memory device 100 may reduce the width of the distributions generated by the threshold voltages of the plurality of multi-bit cells, thereby reducing an error when the data is read.

Figure 8:
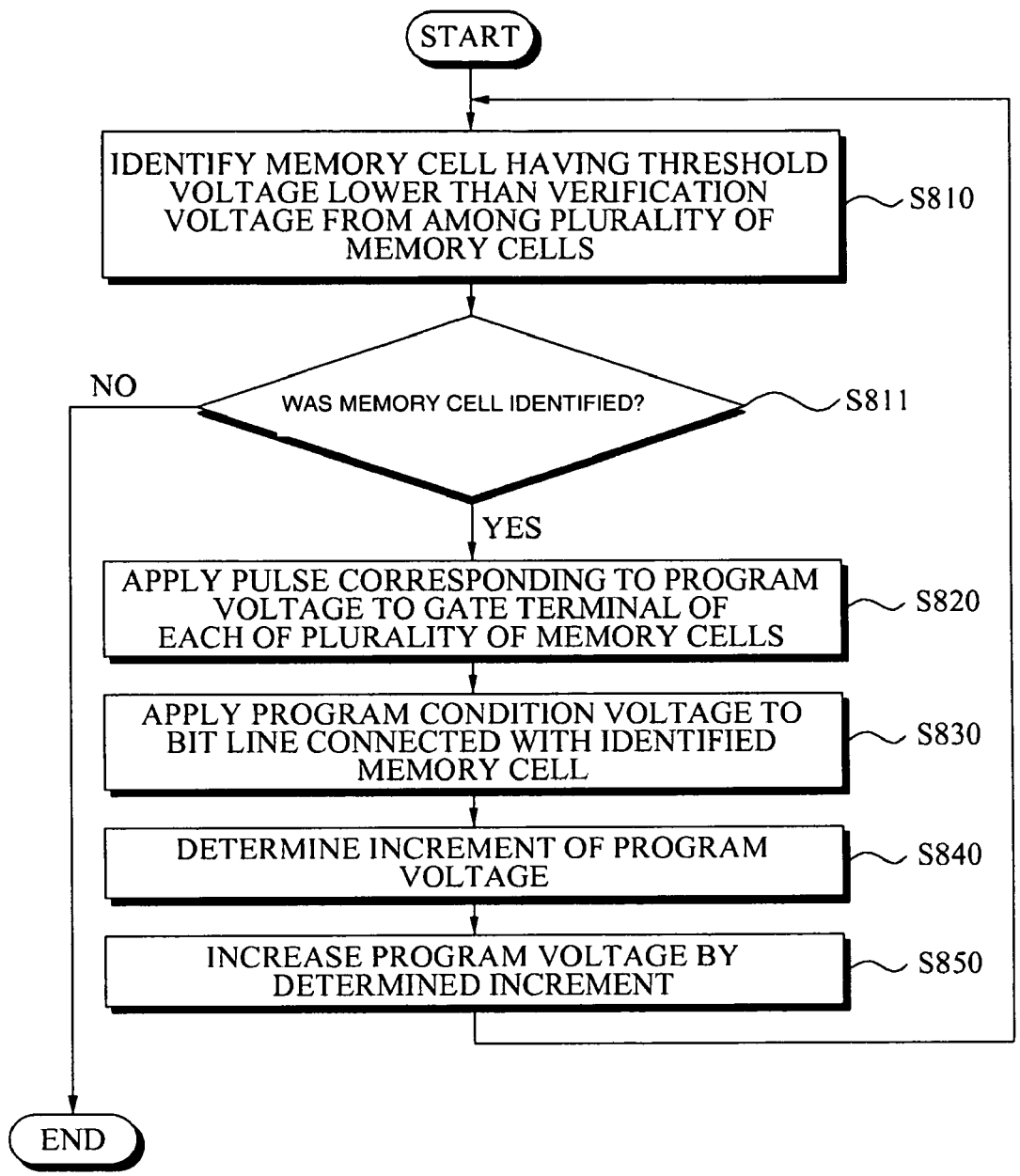
FIG. 8 is a flowchart illustrating a memory programming method according to example embodiments.

FIG. 8 is a flowchart illustrating a memory programming method according to example embodiments.

Referring to FIG. 8, in operation S810, the memory programming method may identify a memory cell having a threshold voltage lower than a verification voltage from among a plurality of memory cells.

In operation S811, the memory programming method may determine whether the identified memory cell exists.

When the identified memory cell does not exist, the memory programming method may terminate a corresponding sequence.

In operation S820, when the identified memory cell exists, the memory programming method may apply a pulse corresponding to a program voltage to a gate terminal of each of a plurality of memory cells.

In operation S830, the memory programming method may apply a program condition voltage to a bit line connected with the identified memory cell.

In operation S840, the memory programming method may determine an increment of the program voltage after the pulse is applied.

In operation S850, the memory programming method may increase the program voltage by the determined increment.

The memory programming method may perform operation S810 again after operation S850 is performed.

Figure 9:
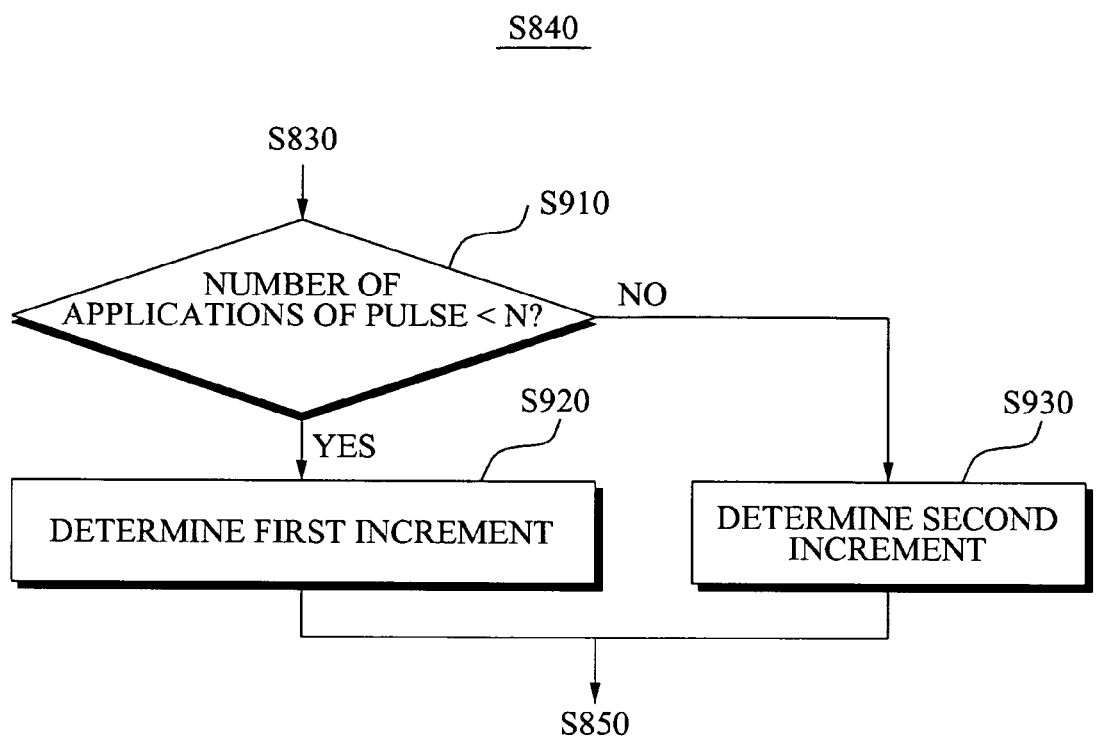
FIG. 9 is a flowchart illustrating an example of determination of an increment of a program voltage in operation S840 of FIG. 8 according to example embodiments.

FIG. 9 is a flowchart illustrating an example of operation S840 of FIG. 8 in detail. Referring to FIG. 9, in operation S910, the memory programming method may determine whether a number of applications of the pulse is less than a certain number of times 'N'.

In operation S920, when the number of applications of the pulse is less than the certain number of times 'N', the memory programming method may determine a first increment as the increment of the program voltage.

In operation S930, when the number of applications of the pulse is greater than or equal to the certain number of times 'N', the memory programming method may determine a second increment as the increment of the program voltage.

The second increment may be greater than the first increment.

When the number of applications of the pulse is greater than or equal to the certain number of times 'N', the memory programming method may regard that a plurality of memory cells reaches a balanced state.

FIG. 10 is a flowchart illustrating another example of operation S840 of FIG. 8 in detail.

Referring to FIG. 10, in operation S1010, the memory programming method may set a first decision voltage lower than the verification voltage after the pulse is applied.

In operation S1020, the memory programming method may count a number of memory cells having the threshold voltage higher than or equal to the first decision voltage.

In operation S1030, the memory programming method may determine whether the number of memory cells having the threshold voltage higher than or equal to the first decision voltage is equal to a previously-counted number of memory cells having the threshold voltage higher than or equal to the first decision voltage.

In operation S1040, when the number of memory cells having the threshold voltage higher than or equal to the first decision voltage is equal to the previously-counted number, the memory programming method may determine the first increment as the increment of the program voltage.

In operation S1050, when the number of memory cells having the threshold voltage higher than or equal to the first decision voltage is different from the previously-counted number, the memory programming method may determine a second increment as the increment of the program voltage.

In operation S1060, the memory programming method may increase the first decision voltage by the determined increment.

Depending on embodiments, the memory programming method may compare the previously-counted number and the currently-counted number to determine whether a plurality of memory cells reaches a balanced state. When the previously-counted number is equal to the currently-counted number, the memory programming method may regard that the plurality of memory cells reaches the balanced state.

FIG. 11 is a flowchart illustrating still another example of operation S840 of FIG. 8 in detail.

Referring to FIG. 11, in operation S1110, the memory programming method may set a first decision voltage and a second decision voltage. The second decision voltage may be higher than the first decision voltage by a first increment.

In operation S1120, the memory programming method may calculate an increment of a number of first memory cells having the threshold voltage, which is lower than the first decision voltage and is higher than or equal to the second decision voltage.

In operation S1130, the memory programming method may calculate an increment of a number of second memory cells having the threshold voltage higher than or equal to the first decision voltage.

In operation S1140, the memory programming method may compare the increment of the number of first memory cells and the increment of the number of second memory cells.

When the increment of the number of first memory cells is equal to the increment of the number of second memory cells, the memory programming method may regard that the plurality of memory cells reaches a balanced state. In operation S1160, when the increment of the number of first memory cells is equal to the increment of the number of second memory cells, the memory programming method may determine a second increment as the increment of the program voltage.

In operation S1150, when the increment of the number of first memory cells is different from the increment of the number of second memory cells, the memory programming method may determines the first increment as the increment of the program voltage.

The memory programming method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media may include, for example, magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions include both machine code, for example produced by a compiler, and files containing higher level code that may be executed by the computer using an interpreter. The described hardware devices may be configured to act as one or more software modules in order to perform the operations of example embodiments.

Example embodiments may be applied to memory devices changing the threshold voltage of the memory cell to store data. Examples of the memory devices may include a flash memory, an Electrically Erasable Programmable Read Only Memory (EEPROM), a Phase Change Random Access Memory (PRAM), a Magnetic Random Access Memory (MRAM), and the like.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a memory controller, and a flash memory device. The flash memory device may store N-bit data via the memory controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. For example, the memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
a memory cell array including a plurality of memory cells;
a programming unit configured to apply a plurality of pulses corresponding to a program voltage to a gate terminal of each of the plurality of memory cells, and to apply a program condition voltage to a bit line connected with a memory cell having a threshold voltage lower than a verification voltage from among the plurality of memory cells; and
a control unit configured to increase the program voltage during a first time interval by a first increment for each pulse, and to increase the program voltage during a second time interval by a second increment for each pulse when the plurality of memory cells have reached a balanced state.

2. The memory device of claim 1, further comprising:
an identification unit configured to identify the memory cell having a threshold voltage lower than the verification voltage from among the plurality of memory cells each time after each of the plurality of pulses is applied.

3. The memory device of claim 1, wherein the programming unit applies the pulse a reference number of times during the first time interval.

4. The memory device of claim 1, wherein the control unit sets a first decision voltage lower than the verification voltage during the first time interval, and determines whether the first time interval is terminated based on a number of memory cells having a threshold voltage higher than or equal to the first decision voltage each time after each of the plurality of pulses is applied.

5. The memory device of claim 4, wherein the control unit increases the first decision voltage by the first increment each time after each of the plurality of pulses is applied, and terminates the first time interval when the number of memory cells having a threshold voltage higher than or equal to the first decision voltage is equal to a previously-counted number of memory cells having a threshold voltage higher than or equal to the first decision voltage.

6. The memory device of claim 1, wherein the control unit sets a first decision voltage lower than the verification voltage and a second decision voltage lower than the first decision voltage during the first time interval, and determines whether the first time interval is terminated based on a number of memory cells having a threshold voltage higher than or equal to the first decision voltage and a number of memory cells having a threshold voltage higher than or equal to the second decision voltage each time after each of the plurality of pulses is applied.

7. The memory device of claim 6, wherein, when an increment of a number of first memory cells having a threshold voltage higher than or equal to the second decision voltage and is lower than the first decision voltage is equal to an increment of a number of second memory cells having a threshold voltage higher than or equal to the first decision voltage, the control unit terminates the first time interval.

8. The memory device of claim 1, wherein the programming unit applies the plurality of pulses to increase a threshold voltage of the memory cell having a threshold voltage lower than the verification voltage from among the plurality of memory cells.

9. The memory device of claim 1, wherein the control unit sets the second increment to be greater than the first increment.

10. The memory device of claim 1, wherein the control unit sets the verification voltage with respect to each of the plurality of memory cells based on data to be programmed in the plurality of memory cells.

11. The memory device of claim 10, wherein the programming unit determines whether each of the plurality of pulses is applied to each of the plurality of memory cells based on the verification voltage being set with respect to each of the plurality of memory cells.

12. The memory device of claim 10, wherein the programming unit selects the verification voltage with respect to each of the plurality of memory cells from among a plurality of verification voltage candidates.

13. The memory device of claim 12, wherein the programming unit compares each of the plurality of verification voltage candidates and a threshold voltage of each of the plurality of memory cells each time after each of the plurality of pulses is applied.

14. The memory device of claim 1, wherein the control unit estimates a number of applications of the plurality of pulses, and determines an initial value of the program voltage based on the estimated number.

15. A memory programming method, the method comprising:
applying a pulse corresponding to a program voltage to a gate terminal of each of a plurality of memory cells;
applying a program condition voltage, while the pulse is applied, to a bit line connected with a memory cell having a threshold voltage lower than a verification voltage from among the plurality of memory cells;
determining an increment of the program voltage after the pulse is applied based on whether or not the plurality of memory cells have reached a balanced state;
increasing the program voltage by the determined increment; and
applying the pulse corresponding to the increased program voltage to a gate terminal of each of the plurality of memory cells.

16. The method of claim 15, wherein the determining includes:
determining a first increment as the increment of the program voltage when a number of applications of the pulse is less than a threshold; and
determining a second increment as the increment of the program voltage when the number of applications of the pulse is greater than or equal to the threshold.

17. The method of claim 15, further comprising:
setting a first decision voltage lower than the verification voltage after the pulse is applied,
wherein the determining determines the increment based on a number of memory cells having a threshold voltage higher than or equal to the first decision voltage.

18. The method of claim 17, further comprising:
increasing the first decision voltage by the increment after the pulse corresponding to the increased program voltage is applied,
wherein the determining includes
determining the first increment as the increment of the program voltage when the number of memory cells having a threshold voltage higher than or equal to the first decision voltage is equal to a previously-counted number of memory cells having a threshold voltage higher than or equal to the first decision voltage; and
determining a second increment greater than the first increment as the increment of the program voltage when the number of memory cells having a threshold voltage higher than or equal to the first decision voltage is different from the previously-counted number of memory cells having a threshold voltage higher than or equal to the first decision voltage.

19. The method of claim 15, further comprising:
setting a first decision voltage lower than the verification voltage and a second decision voltage lower than the first decision voltage after the pulse is applied,
wherein the determining determines the increment based on a number of memory cells having a threshold voltage higher than or equal to the first decision voltage and a number of memory cells having a threshold voltage higher than or equal to the second decision voltage.

20. The method of claim 19, wherein the determining includes:
calculating an increment of a number of first memory cells having a threshold voltage which is higher than or equal to the second decision voltage and is lower than the first decision voltage;
calculating an increment of a number of second memory cells having a threshold voltage higher than or equal to the first decision voltage;
determining a first increment as the increment of the program voltage when the increment of the number of first memory cells is greater than the increment of the number of second memory cells; and
determining a second increment as the increment of the program voltage when the increment of the number of first memory cells is equal to the increment of the number of second memory cells, the second increment being greater than the first increment.

21. A computer-readable recording medium storing a program for implementing the method of claim 15.

* * * * *